United States Patent
Wang (10) Patent No.: US 7,595,245 B2
(45) Date of Patent: Sep. 29, 2009

(54) SEMICONDUCTOR DEVICE HAVING A GATE ELECTRODE MATERIAL FEATURE LOCATED ADJACENT A GATE WIDTH SIDE OF ITS GATE ELECTRODE AND A METHOD OF MANUFACTURE THEREFOR

(75) Inventor: Dening Wang, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 480 days.

(21) Appl. No.: 11/202,835

(22) Filed: Aug. 12, 2005

(65) Prior Publication Data

US 2007/0034969 A1 Feb. 15, 2007

(51) Int. Cl.
*H01L 21/00* (2006.01)
(52) U.S. Cl. ............ 438/300; 438/304; 438/592
(58) Field of Classification Search .............. 438/300, 438/304, 592
See application file for complete search history.

(56) References Cited

U.S. PATENT DOCUMENTS

| | | | | | |
|---|---|---|---|---|---|
| 5,436,483 | A * | 7/1995 | Iwai et al. | ............ | 257/360 |
| 5,534,723 | A * | 7/1996 | Iwai et al. | ............ | 257/360 |
| 5,763,919 | A | 6/1998 | Lin et al. | | |
| 6,583,972 | B2 | 6/2003 | Verhaege et al. | ............ | 361/56 |
| 6,587,320 | B1 * | 7/2003 | Russ et al. | ............ | 361/56 |
| 6,670,677 | B2 * | 12/2003 | Choe et al. | ............ | 257/355 |
| 6,881,621 | B2 * | 4/2005 | Choe et al. | ............ | 438/251 |
| 6,897,536 | B2 * | 5/2005 | Nomura et al. | ............ | 257/403 |
| 7,002,223 | B2 * | 2/2006 | Kwon | ............ | 257/384 |
| 7,102,197 | B2 * | 9/2006 | Ichikawa | ............ | 257/357 |
| 7,138,313 | B2 * | 11/2006 | Chatty et al. | ............ | 438/237 |
| 7,172,944 | B2 * | 2/2007 | Kwon | ............ | 438/304 |
| 7,183,612 | B2 * | 2/2007 | Okushima | ............ | 257/350 |
| 7,253,436 | B2 * | 8/2007 | Matsumoto et al. | ............ | 257/48 |
| 7,307,333 | B2 * | 12/2007 | Itoh et al. | ............ | 257/532 |
| 7,348,642 | B2 * | 3/2008 | Nowak | ............ | 257/401 |
| 7,355,252 | B2 * | 4/2008 | Kim et al. | ............ | 257/360 |
| 2002/0033507 | A1 * | 3/2002 | Verhaege et al. | ............ | 257/360 |
| 2002/0175378 | A1 * | 11/2002 | Choe et al. | ............ | 257/355 |
| 2003/0025163 | A1 * | 2/2003 | Kwon | ............ | 257/360 |
| 2003/0227053 | A1 * | 12/2003 | Nomura et al. | ............ | 257/344 |
| 2004/0099910 | A1 * | 5/2004 | Choe et al. | ............ | 257/347 |
| 2005/0017306 | A1 * | 1/2005 | Morishita | ............ | 257/355 |
| 2005/0017320 | A1 * | 1/2005 | Itoh et al. | ............ | 257/532 |
| 2005/0045958 | A1 * | 3/2005 | Ichikawa | ............ | 257/362 |
| 2005/0133839 | A1 * | 6/2005 | Okushima | ............ | 257/293 |
| 2006/0079060 | A1 * | 4/2006 | Kwon | ............ | 438/300 |
| 2006/0186474 | A1 * | 8/2006 | Matsumoto et al. | ............ | 257/347 |
| 2006/0273398 | A1 * | 12/2006 | Suzuki et al. | ............ | 257/355 |
| 2007/0029624 | A1 * | 2/2007 | Nowak | ............ | 257/401 |
| 2007/0034969 | A1 * | 2/2007 | Wang | ............ | 257/382 |
| 2007/0052031 | A1 * | 3/2007 | Kinoshita | ............ | 257/355 |

(Continued)

*Primary Examiner*—Laura M Menz
(74) *Attorney, Agent, or Firm*—Wade J. Brady, III; Frederick J. Telecky, Jr.

(57) ABSTRACT

The present invention provides a semiconductor device, a method of manufacture therefore and an integrated circuit including the same. The semiconductor device (300), without limitation, may include a gate electrode (320) having a gate length (l) and a gate width (w) located over a substrate (310) and a gate electrode material feature (330) located adjacent a gate width (w) side of the gate electrode (320). The semiconductor device (300) may further include a silicide region (350) located over the substrate (310) proximate a side of the gate electrode (320), the gate electrode material feature (330) breaking the silicided region (350) into multiple silicide portions (353, 355, 358).

16 Claims, 6 Drawing Sheets

U.S. PATENT DOCUMENTS

| | | | |
|---|---|---|---|
| 2007/0187777 A1* | 8/2007 | Itoh et al. | 257/379 |
| 2007/0230074 A1* | 10/2007 | Kato | 361/56 |
| 2007/0241407 A1* | 10/2007 | Kim et al. | 257/371 |
| 2008/0067599 A1* | 3/2008 | Tsutsumi et al. | 257/358 |
| 2008/0087968 A1* | 4/2008 | Nowak | 257/401 |
| 2008/0099857 A1* | 5/2008 | Furuta et al. | 257/401 |
| 2008/0111163 A1* | 5/2008 | Russ et al. | 257/280 |
| 2008/0124868 A1* | 5/2008 | Nowak | 438/268 |
| 2008/0188047 A1* | 8/2008 | Kim et al. | 438/234 |
| 2008/0290419 A1* | 11/2008 | Leibiger | 257/369 |

\* cited by examiner

SEMICONDUCTOR DEVICE HAVING A GATE ELECTRODE MATERIAL FEATURE LOCATED ADJACENT A GATE WIDTH SIDE OF ITS GATE ELECTRODE AND A METHOD OF MANUFACTURE THEREFOR

TECHNICAL FIELD OF THE INVENTION

The present invention is directed, in general, to a semiconductor device and, more specifically, to a semiconductor device having a gate electrode material feature located adjacent a gate width side of its gate electrode, a method of manufacture therefor, and a method for manufacturing an integrated circuit including the same.

BACKGROUND OF THE INVENTION

Integrated circuits including metal-oxide-semiconductor (MOS) transistors receive input signals and transfer output signals in the form of a voltage. These devices are typically made with very small device dimensions in order to maximize the amount of circuitry that can be implemented on the integrated circuit and to allow the circuitry to operate at high frequencies yet with minimal power demands. A problem with these devices, however, is their sensitivity to damage from electrostatic discharge (ESD) applied to the input terminals, output terminals or to internal circuit nodes of the integrated circuit.

As is well known, ESD events, although brief, may exhibit relatively large currents, on the order of amperes. In order to combat problems associated with ESD events, manufacturers of MOS devices design protection devices that provide paths through which to discharge nodes rapidly so that the voltage on the nodes may be clamped to a safe level. Protection devices may be positioned between the input buffer or output buffer pads of a device and a source of reference potential (e.g., ground) to quickly conduct the ESD current away from the devices that may be harmed.

Figure 1:
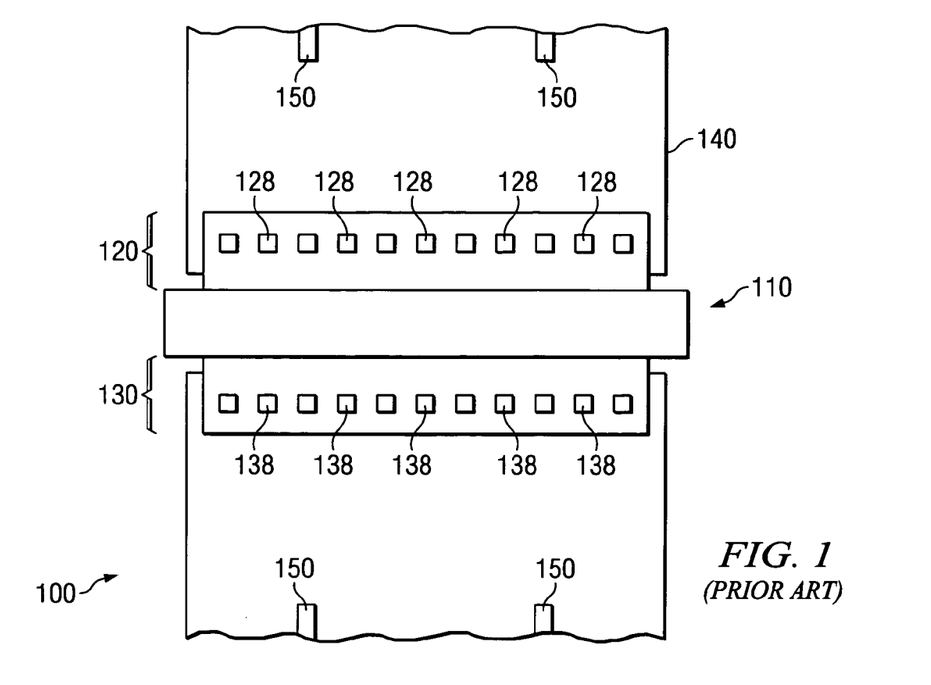
FIG. 1 illustrates a top-plan view of a conventional ESD protection device.

Turning now to FIG. 1, illustrated is a top-plan view of one such ESD protection device 100. The ESD protection device 100 is implemented as an N-channel MOS transistor having source and drain regions and a gate electrode over a channel region that separates the source and drain regions. Although the device is implemented as an MOS transistor, it operates, in ESD protection mode as a parasitic bipolar transistor having a collector region corresponding to the drain region, an emitter region corresponding to the source region and a base region corresponding to the channel region. In a typical configuration, the gate electrode is tied to a source of reference potential (e.g., ground) either by a direct connection or through a resistive connection. As is well known, when the potential between the collector and the emitter ($V_{ce}$) of the bipolar transistor becomes greater than a predetermined voltage, known as the trigger voltage, the voltage $V_{ce}$ snaps back to a lower value. The device clamps the voltage at this lower value, known as the holding voltage. In this conduction mode, the transistor presents very low impedance and, thus, conducts any current to ground.

The ESD protection device 100 shown in FIG. 1 includes multiple channels through which the relatively high ESD currents may be conducted in order to reduce the voltage and current stress on the device. Each channel is defined by a metal connecting terminal 128, in the drain region 120 of the transistor 110, and a corresponding metal connecting terminal 138 in the source region 130 of the transistor 110. Connecting terminals 128, 138 are connected to solid metal connections 140. Metal openings or slots 150 are sometimes required for various process reasons.

Ideally, during an ESD condition, substantially equal "current paths" are established between each pair of connecting terminals 128, 138, creating multiple nonintersecting and nondiscriminating paths to discharge the ESD current. However, due to the snapback issues mentioned above, such an ideal situation rarely, if ever, occurs. For instance, the aforementioned snapback makes it hard for NMOS transistors to distribute current evenly among the channels, because, as soon as snap-back happens, $V_{ce}$ on one turned-on channel drops to a holding voltage, which is lower than the trigger voltage of the other channels and therefore, other channels do not have a chance to turn on. Accordingly, snapback is a significant problem for the multiple channels in an ESD event.

Another trend in semiconductor processing is to apply silicide to the source and drain regions of MOS transistors in order to improve their performance. Silicided regions typically exhibit lower surface resistance than the doped silicon that forms the source and drain regions. Applying silicide to the source and drain regions of an ESD protection device, however, may affect the performance of the device. Because the silicide may have a relatively rough edge next to the gate, this may lead to high local electrical fields and to degradation of the edges by high current densities (and corresponding increases in temperature). Because the silicide has a relatively low sheet resistance, it may also kill whatever ballasting existed between drain contact and gate and make the multiple channel snapback issue even worse.

Figure 2:
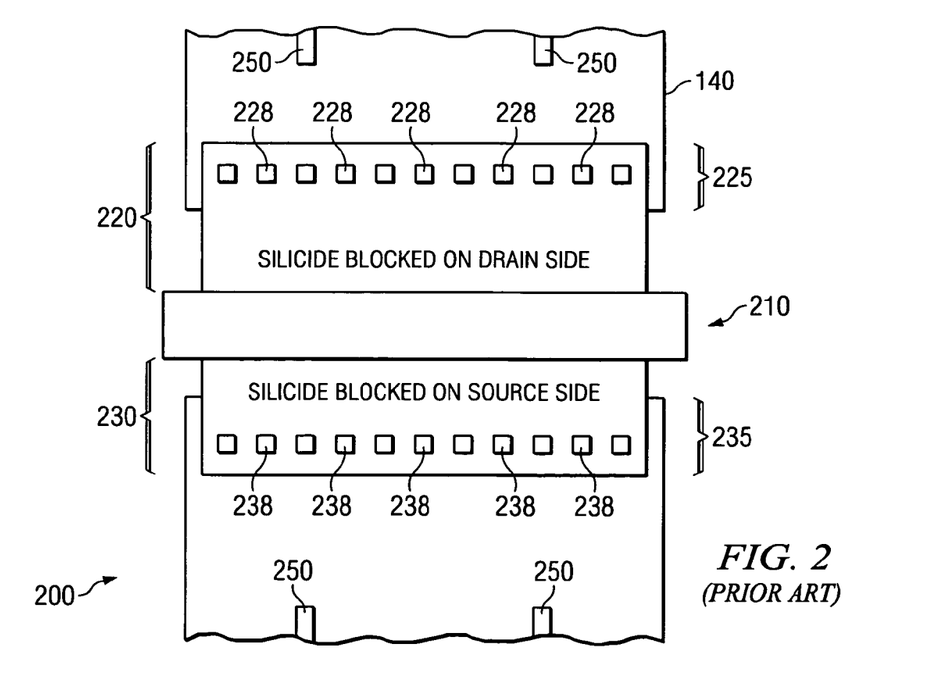
FIG. 2 illustrates a plan view of an ESD protection device, which uses local blocking of the silicide to introduce ballasting.

Turning now to FIG. 2, illustrated is a plan view of an ESD protection device 200, which uses blocking of the silicide to introduce ballasting. The ESD protection device 200 shown in FIG. 2 containing discrete connecting terminals 228 and 238 has the silicided blocked on both the source side and the drain side. Ballasting occurs due to the aspect ratio of the width of the structure to the length of the regions in which silicide is not applied. One disadvantage of the configuration depicted in FIG. 2 is that the additional processing steps required to form devices in which silicide is selectively applied are costly.

One other way to solve snapback issue in NMOS type ESD protection is to use external ballasting resistors on the drain fingers in a multiple finger NMOS. When one of the drain fingers turns on and snaps back, the product of its current and ballasting resistance on this finger is going to generate a voltage high enough to trigger other fingers and therefore enable all the fingers to evenly conduct ESD current. This efficiently increases ESD robustness of NMOS devices. Obviously, a disadvantage of this solution is it costs too much silicon area (from ballast resistors).

Attempts also have been made to provide ESD protection, as described in U.S. Pat. No. 5,763,919, by implementing a MOS transistor array structure having dispersed parallel discharge paths. These dispersed parallel discharge paths are formed in the n-well regions and in the N+ drain regions of the structure. The dispersed N+ drain regions are defined by local oxidation or shallow trench isolation (STI). The part of the N+ to substrate junction close to the local oxidation or STI interface may exhibit mechanical stress causing, among other things, electric field focal points, current leakage and susceptibility to breakdown. This structure also has non-linear discharge path resistance due to the N-well, and the performance of the structure is dependent upon the diffusion/well resistance. Another feature of this structure is that the dispersed parallel discharge paths are not isolated from the substrate, thus causing potential breakdown to the substrate (dispersed N+ drain regions) and adding undesirable additional parasitic capacitance (dispersed N+ regions and N-well regions).

Accordingly, what is needed in the art is an ESD protection circuit that provides the benefits of traditional ESD protection circuit without the drawbacks.

SUMMARY OF THE INVENTION

To address the above-discussed deficiencies of the prior art, the present invention provides a semiconductor device, a method of manufacture therefore and an integrated circuit including the same. The semiconductor device, without limitation, may include a gate electrode having a gate length and a gate width located over a substrate, and a gate electrode material feature located adjacent a gate width side of the gate electrode. The semiconductor device may further include a silicide region located over the substrate proximate a side of the gate electrode, the gate electrode material feature breaking the silicided region into multiple silicide portions.

As mentioned in the paragraph above, another embodiment of the present invention includes a method for manufacturing a semiconductor device. The method for manufacturing the semiconductor device may include forming a layer of gate electrode material over a substrate, and patterning the layer of gate electrode material to form a gate electrode having a gate length and a gate width, and a gate electrode material feature located adjacent a gate width side of the gate electrode. In accordance with this embodiment, the method may further include forming a silicide region over the substrate proximate a side of the gate electrode, the gate electrode material feature breaking the silicided region into multiple silicide portions.

In addition to the semiconductor device and method of manufacture described above, an alternative embodiment of the present invention is an integrated circuit. The integrated circuit, again without limitation, may include: 1) a semiconductor device located over or in a substrate, the semiconductor device being somewhat similar to that in the embodiment disclosed above, and 2) interconnects located within dielectric layers located over the semiconductor device for contacting the semiconductor device and forming an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

Prior Art

DETAILED DESCRIPTION

The present invention is based, at least in part, on the recognition that ballasting is an important feature in today's electrostatic discharge (ESD) sensitive devices, particularly those having silicide regions that unfortunately tend to substantially increase current crowding. Given this recognition, the present invention acknowledged that the gate electrode material traditionally patterned to form the gate electrodes could also be patterned to form gate electrode material features introducing the desired ballasting. It was particularly acknowledged that the gate electrode material features could be used to block the formation of silicide regions in certain areas of the semiconductor device. In one exemplary embodiment, the present invention acknowledged that the gate electrodes and gate electrode material features could be simultaneously patterned from a single layer of gate electrode material. Accordingly, the ballasting could be implemented with limited, if any, additional processing steps, and thus cost. It is believed that the broken silicide regions formed as a result of the gate electrode material features is going to help use the contact/via resistance as ballasting resistance, since otherwise the contact/via resistance is shortened by the silicided.

Figure 3:
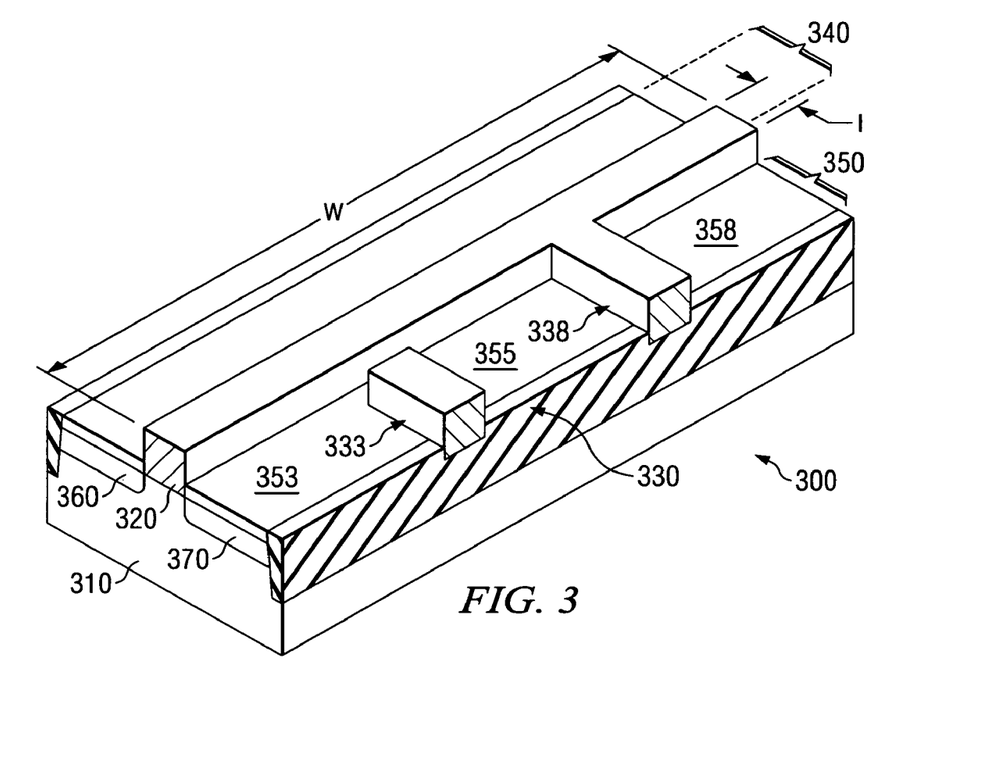
FIG. 3 illustrates one embodiment of a plan view of a semiconductor device manufactured in accordance with the principles of the present invention.

Turning now to FIG. 3, illustrated is one embodiment of a plan view of a semiconductor device 300 manufactured in accordance with the principles of the present invention. The semiconductor device 300 illustrated in FIG. 3 is a configured as an electrostatic discharge (ESD) sensitive device. Nevertheless, other embodiments of the present invention exist wherein the semiconductor device 300 is not configured as an ESD device.

The semiconductor device 300 initially includes a substrate 310. The substrate 310 may, in an exemplary embodiment, be any layer located in the semiconductor device 300, including a wafer itself or a layer located above the wafer (e.g., epitaxial layer). In the illustrative embodiment shown, the substrate 310 comprises an epitaxial silicon layer.

The semiconductor device 300 further includes a gate electrode 320 having a gate length (l) and a gate width (w). Gate length (l) and gate width (w), as used herein, are intended to be used in accordance with the standard usage in the semiconductor industry for transistor devices. For instance, gate length (l) is intended to represent the dimension of the gate electrode in the direction of current flow. Accordingly, gate width (w) is intended to represent the dimension of the gate electrode in the direction substantially perpendicular to the direction of current flow.

The semiconductor device 300 further includes one or more gate electrode material features 330 located adjacent the gate width (w) side of the gate electrode 320. In the given embodiment of FIG. 3, the semiconductor device 300 includes a first gate electrode material feature 333 and a second gate electrode material feature 338. The first gate electrode material feature 333, as depicted, is positioned proximate the gate electrode 320, but not touching the gate electrode 320. On the other hand, the second gate electrode material feature 338 extends from the gate width (w) side of the gate electrode 320. Both of these embodiments are within the broad purview of the present invention.

The semiconductor device 300 illustrated in FIG. 3 depicts that only the first and second gate electrode material features 333, 338 exist therein, each of the first and second gate electrode material features 333, 338 having specific locations and dimensions. Those skilled in the art understand, however, that the number, size, location, etc. of the gate electrode material features 330 may be optimized for a given semiconductor device 300. For example, those features, as well as other conceivable features, could be adjusted to provide the requisite amount of ballasting. Given the disclosures of the present invention, one skilled in the semiconductor arts would understand how to make these adjustments to achieve the desired ballasting.

The semiconductor device 300 illustrated in FIG. 3 further includes silicide regions 340, 350 located over a source region 360 and a drain region 370 located in the substrate 310, respectively. As is illustrated in FIG. 3, the first and second gate electrode material features 333, 338 break the silicide region 350 into multiple silicide portions 353, 355 and 358. Obviously the number of silicide portions that the silicide region 350 is broken into depends on the number of gate electrode material features 330. As previously mentioned, it is believed that breaking the silicide regions 350 into the multiple silicide portions, in this instance silicide portions 353, 355, and 358, provides the ballasting.

Take notice how in the semiconductor device 300 of FIG. 3 the gate electrode material features 330 are located proximate the drain region 370 side thereof. As a result of the electrical properties of the semiconductor device 300, particularly when the semiconductor device 300 is an n-channel metal oxide semiconductor (NMOS) device, exemplary results may be obtained when the gate electrode material features 330 are located on the drain region 370 side thereof. Nevertheless, as discussed further below, other embodiments exist wherein gate electrode material features are located on both the drain region and source region side of the semiconductor device, or alternatively on just the source region side of the semiconductor device.

Figure 4:
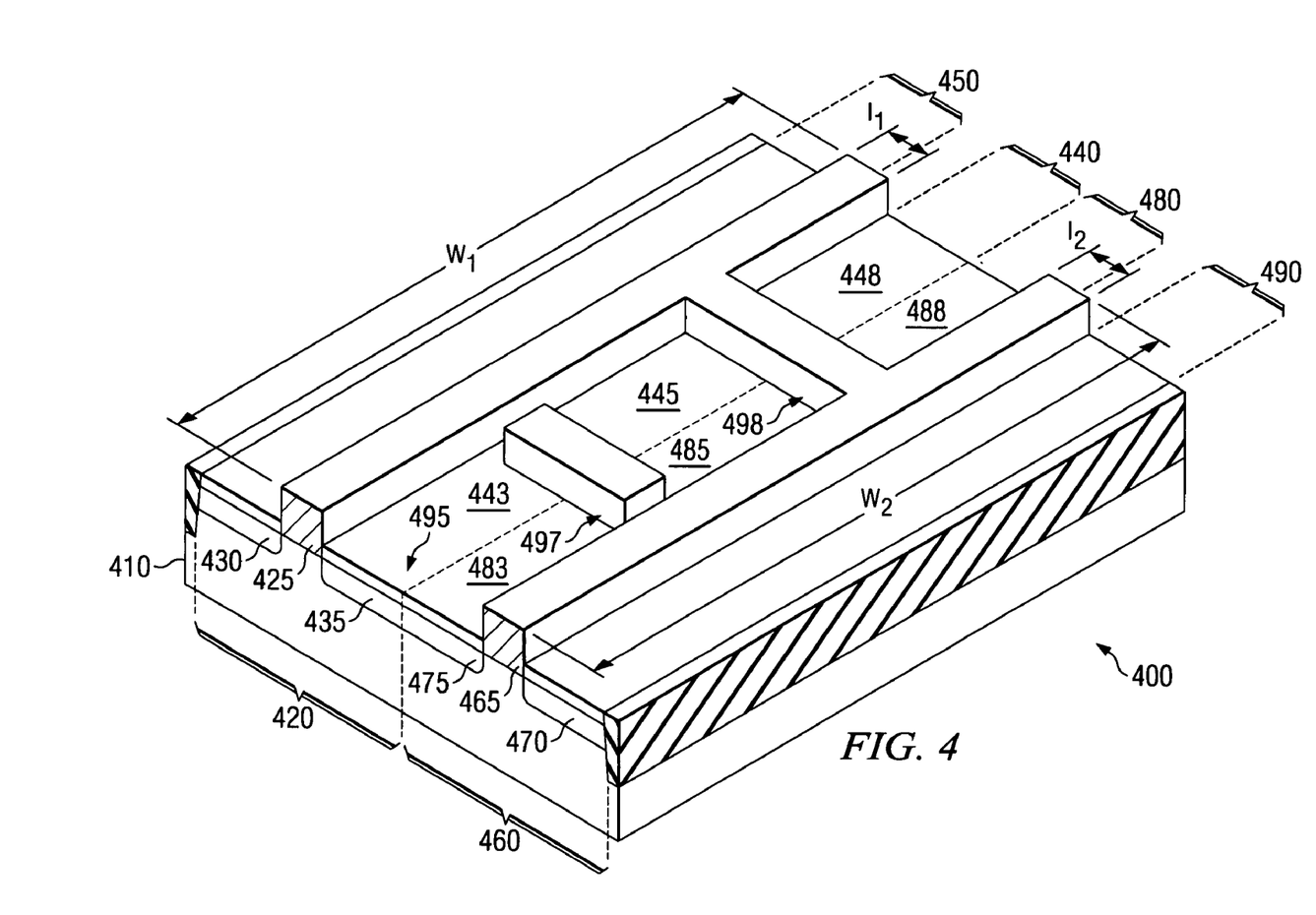
FIG. 4 illustrates a plan view of an alternative embodiment of a semiconductor device manufactured in accordance with the principles of the present invention.

Turning now to FIG. 4 illustrated is a plan view of an alternative embodiment of a semiconductor device 400 manufactured in accordance with the principles of the present invention. The semiconductor device 400 also includes a substrate 410. Located over and/or in the substrate 410 are a first transistor device 420 and a second transistor device 460. The first transistor device 420 includes a first gate electrode 425 having a first gate length ($l_1$) and a first gate width ($w_1$). The first transistor device 420 further includes a first source region 430 and a first drain region 435, the first source region 430 and first drain region 435 located in the substrate 410 proximate the first gate electrode 425.

Alternatively, the second transistor device 460 includes a second gate electrode 465 having a second gate length ($l_2$) and a second gate width ($w_2$). The second transistor device 460 further includes a second source region 470 and a second drain region 475, the second source region 470 and second drain region 475 located in the substrate 410 proximate the second gate electrode 465. In the embodiment illustrated in FIG. 4, the first drain region 435 and the second drain region 475 use the same doped region for both. In this embodiment the dotted line illustrates a phantom partition between the first and second drain regions 435, 475. Nevertheless, in other embodiments of the invention, each of the first and second drain regions 435, 475 could be separated by an isolation structure, thus a real partition would exist between the two.

Unique to this embodiment of the present invention, and in contrast to the embodiment of FIG. 3, the semiconductor device 400 further includes one or more gate electrode material features 495 located between the first and second gate electrodes 425, 465. Particularly, the embodiment of FIG. 4 includes a first gate electrode material feature 497 and a second gate electrode material feature 498 located between the first and second gate electrodes 425, 465. In the embodiment of FIG. 4, the first gate electrode material feature 497 is located adjacent both the first and second gate electrodes 425, 465, but does not extend from either. In contrast, the second gate electrode material feature 498 extends from both the first and second gate electrodes 425, 465, thereby connecting the two. Another embodiment may exist wherein a gate electrode material feature 490 may extend from the first gate electrode 425 and only be located adjacent the second gate electrode 465, or vice versa.

As a result of the gate electrode material features 490, a silicide region 440 located over the drain region 435 of the first transistor 420 is broken into multiple silicide portions 443, 445, 448. Similarly, a silicide region 480 located over the drain region 475 of the second transistor 460 is broken into multiple silicide portions 483, 485, 488. In this embodiment the silicide region 450 located over the source region 430 of the first transistor 420 remains unbroken and the silicide region 490 located over the source region 470 of the second transistor 460 remains unbroken. This idea is similar to that discussed above wherein advantageous results are obtained wherein the gate electrode material features 495 are located over the drain region side of the transistor devices.

Figure 5:
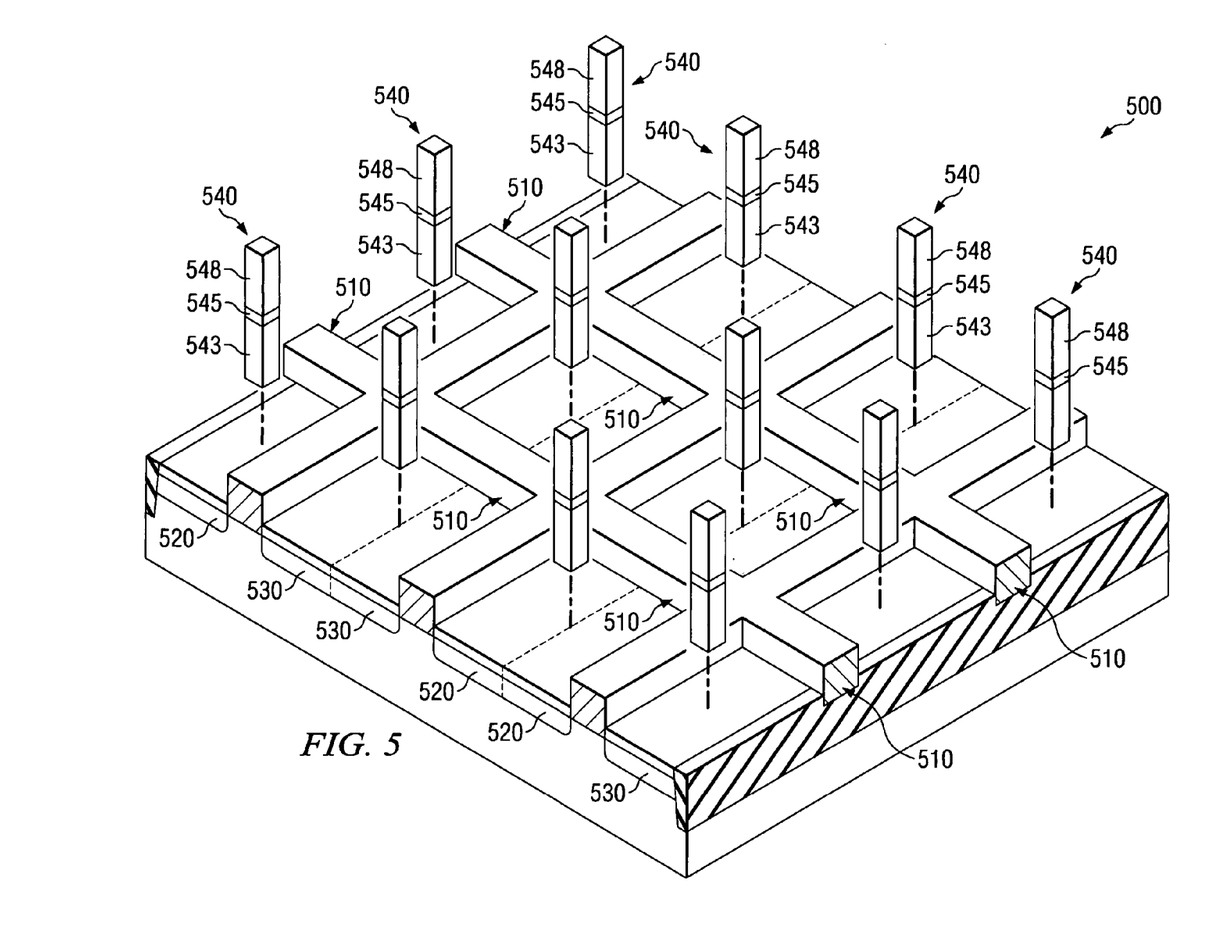
FIG. 5 illustrates another plan view of an alternative embodiment of a semiconductor device manufactured in accordance with the principles of the present invention.

Turning now briefly to FIG. 5, illustrated is a plan view of an alternative embodiment of a semiconductor device 500 manufactured in accordance with the principles of the present invention. The embodiment illustrated in FIG. 5 is used for nothing more than to illustrated that in certain embodiments the gate electrode material portions 510 may be located proximate both the source regions 520 and the drain regions 530 of the various transistor devices.

Also illustrated in FIG. 5 are contact structures 540 contacting the broken silicided regions in the source regions 520 and the drain regions 530. As might be expected, each of the contact structures 540 include a contact 543, a metal level 545 and a via 548, all of which could be surrounded by dielectric materials. The contact structures 540 advantageously help provide ballast resistance to the semiconductor device 500.

Figure 6:
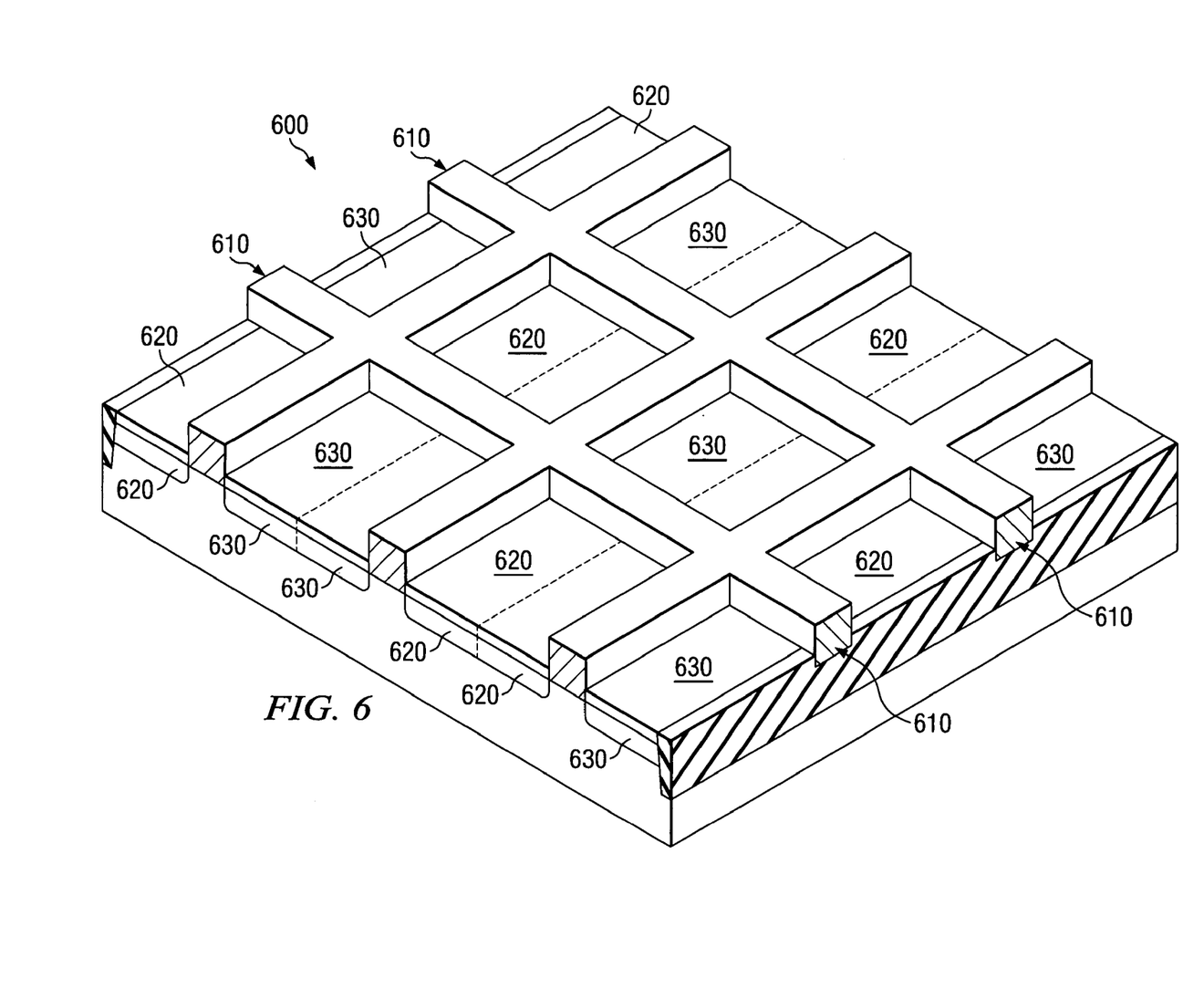
FIG. 6 illustrates a cross-sectional view of an alternative embodiment of a semiconductor device manufactured in accordance with the principles of the present invention.

Turning now to FIG. 6, illustrated is a plan view of an alternative embodiment of a semiconductor device 600 manufactured in accordance with the principles of the present invention. The semiconductor device 600 illustrated in FIG. 6 is similar to the semiconductor device 500 illustrated in FIG. 5 with the exception that the source regions 620 and the drain regions 630 alternate along the rows as well as along the columns between the gate electrode material portions 610 in the semiconductor device 600. Although not illustrated in FIG. 6, adding contact or via structures to the source regions 620 and the drain regions 630 advantageously helps provide ballast resistance to the semiconductor device 600.

Now that certain semiconductor devices manufactured in accordance with the principles of the present invention have been disclosed, the discussion now briefly turns to the manufacture of such devices. In theory, the manufacture of these devices is quite simple, as is generally desired in the industry. In fact, no additional processing steps are typically required to manufacture a device covered by the present invention, as compared to a traditional semiconductor device not containing the gate electrode material features.

For example, in one simple embodiment, the blanket layer of gate electrode material (e.g., polysilicon) that is typically patterned to form the gate electrodes is now patterned to include both the gate electrodes and the desired number and placement of the gate electrode material features. Thus, the gate electrodes and the gate electrode material features comprise the same material. Accordingly, the only modification that need be made to the manufacturing process in this embodiment is to the mask used to pattern the blanket layer of gate electrode material.

After patterning the blanket layer of gate electrode material to include the gate electrodes and the gate electrode material features, the process would continue in a conventional manner by forming the source/drain regions and then the silicide regions. Again, the gate electrode material features would be used to prevent the silicide regions from forming in certain areas of the semiconductor device.

Figure 7:
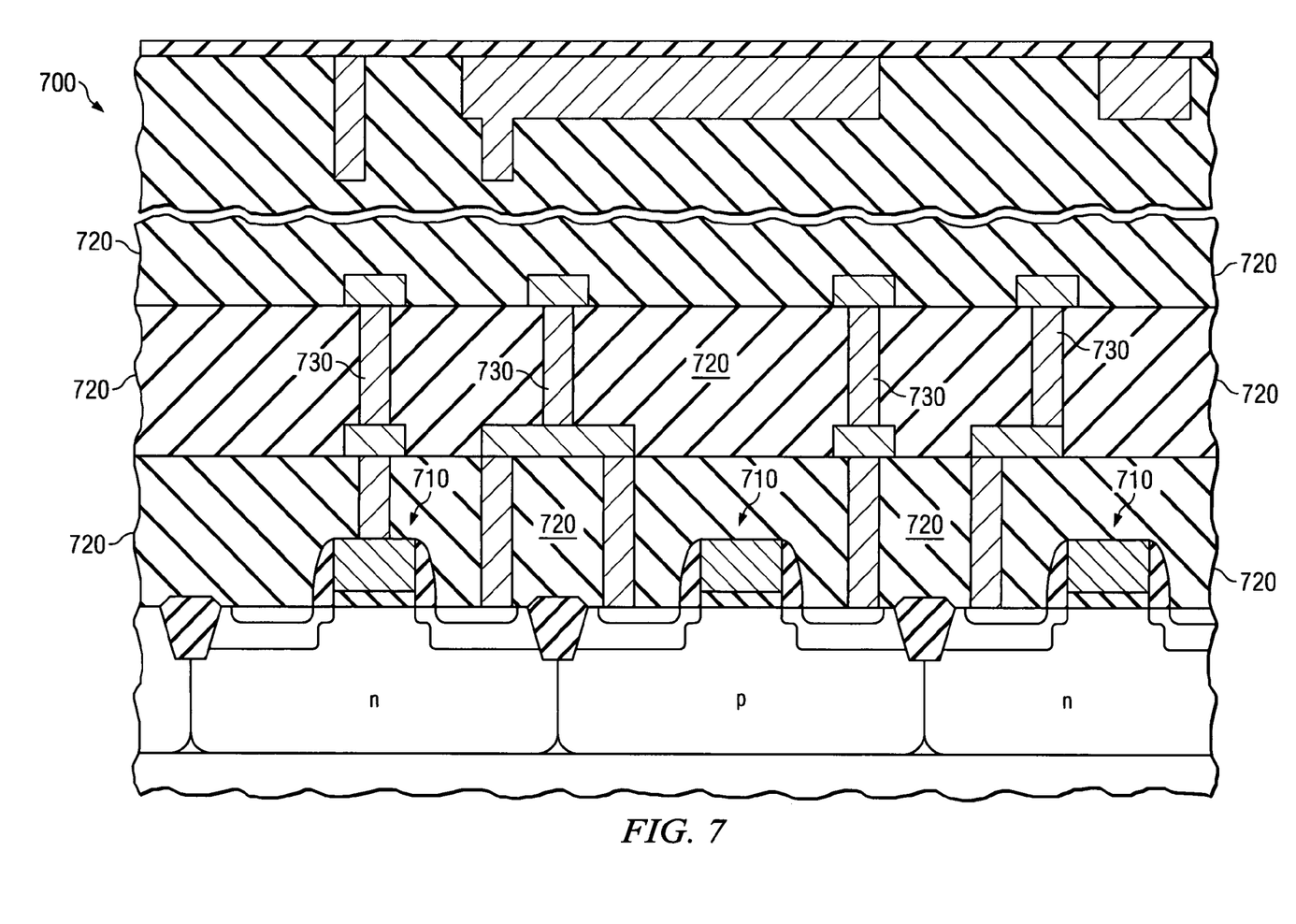
FIG. 7 illustrates a cross-sectional view of a conventional integrated circuit (IC) incorporating a semiconductor device constructed according to the principles of the present invention.

Referring finally to FIG. 7, illustrated is a cross-sectional view of a conventional integrated circuit (IC) 700 incorporating a semiconductor device 710 constructed according to the principles of the present invention. The IC 700 may include devices, such as transistors used to form CMOS devices, BiCMOS devices, Bipolar devices, or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes the semiconductor devices 710 having dielectric layers 720 located thereover. Additionally, interconnect structures 730 are located within the dielectric layers 720 to interconnect various devices, thus, forming the operational integrated circuit 700.

Although the present invention has been described in detail, those skilled in the art should understand that they could make various changes, substitutions and alterations herein without departing from the spirit and scope of the invention in its broadest form.

What is claimed is:

1. A method for manufacturing a semiconductor device, comprising:
    forming a layer of gate electrode material over a substrate;
    patterning the layer of gate electrode material to form a gate electrode having a gate length and a gate width and one or more gate electrode material features located adjacent a gate width side of the gate electrode; and
    forming a silicide region within the substrate proximate a side of the gate electrode, the one or more gate electrode material features blocking formation of silicide within the substrate and breaking the silicided region into multiple silicide portions, and further wherein the one or more gate electrode material features are the only silicide blocking features used to form the silicide region.

2. The method as recited in claim 1 wherein at least one of the one or more gate electrode material features extends from the gate width side of the gate electrode.

3. The method as recited in claim 1 wherein the gate electrode and the gate electrode material comprise polysilicon.

4. The method as recited in claim 1 further including forming a source region and a drain region in the substrate proximate the gate electrode and wherein the one or more gate electrode material features are located proximate a side of the gate electrode where the drain region is located.

5. The method as recited in claim 1 wherein the gate electrode is a first gate electrode having a first gate length and a first gate width and further including a second gate electrode having a second gate length and a second gate width located over the substrate and proximate the first gate electrode, and further wherein the one or more gate electrode material features are located between the first and second gate electrodes.

6. The method as recited in claim 1 wherein at least one of the gate electrode material features connects the first and second gate electrodes.

7. The method as recited in claim 6 further including a first source region and a first drain region located in the substrate proximate the first gate electrode, and a second source region and a second drain region located in the substrate proximate the second gate electrode, wherein the one or more gate electrode material features are located proximate a side of the first gate electrode where the first drain region is located or a side of the second gate electrode where the second drain region is located.

8. The method as recited in claim 7 wherein the one or more gate electrode material features are located proximate the side of the first gate electrode where the first drain region is located and the side of the second gate electrode where the second drain region is located.

9. The method as recited in claim 1 wherein the gate electrode forms at least a portion of an electrostatic discharge sensitive device.

10. The method as recited in claim 1 wherein the gate electrode forms at least a portion of an n-channel metal oxide semiconductor (NMOS) device.

11. The method as recited in claim 1 further including contacting one or more of the multiple silicided portions using contact structures for providing ballast resistance.

12. The method as recited in claim 1 wherein the forming the silicide region further includes forming the silicide region in an upper surface of the gate electrode.

13. A method for manufacturing a semiconductor device, comprising:
    forming a layer of gate electrode material over a substrate;
    patterning the layer of gate electrode material to form a first and second gate electrodes and one or more first gate electrode material features, each of said first and second gate electrodes having a gate length and a gate width, said one or more first gate electrode material features located between the gate width sides of said first and second gate electrodes, at least one of said one or more first gate electrode material features being spaced from said first gate electrode;
    forming source and drain regions in the substrate proximate the first gate electrode and the second gate electrode; and
    forming a suicide region within at least one of the source and drain regions, the one or more first gate electrode material features blocking formation of silicide within said at least one of the source and drain regions, wherein the one or more gate electrode material features are the only silicide blocking features used to form the silicide region.

14. The method as recited in claim 13 wherein said one or more first gate electrode material features extend from said second gate electrode.

15. The method as recited in claim 13 wherein said one or more first gate electrode material features are spaced from said second gate electrode.

16. The method as recited in claim 13 wherein said step of patterning the layer of gate electrode material forms one or more second gate electrode material features located between the gate width sides of said first and second gate electrodes and extending from said first gate electrode to said second gate electrode.

* * * * *

UNITED STATES PATENT AND TRADEMARK OFFICE
CERTIFICATE OF CORRECTION

| | |
|---|---|
| PATENT NO. | : 7,595,245 B2 |
| APPLICATION NO. | : 11/202835 |
| DATED | : September 29, 2009 |
| INVENTOR(S) | : Dening Wang |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 889 days.

Signed and Sealed this

Twenty-eighth Day of September, 2010

David J. Kappos
*Director of the United States Patent and Trademark Office*